United States Patent [19]
Lee et al.

[11] Patent Number: 6,034,200
[45] Date of Patent: Mar. 7, 2000

[54] HEAT-CURABLE EPOXY RESIN COMPOSITION

[75] Inventors: Jae-Rock Lee; Soo-Jin Park; Sang-Bong Lee, all of Daejeon, Rep. of Korea

[73] Assignee: Korea Research Institute of Chemical Tech., Rep. of Korea

[21] Appl. No.: 09/040,156

[22] Filed: Mar. 17, 1998

[30] Foreign Application Priority Data

Mar. 17, 1997 [KR] Rep. of Korea ............ 97-8961

[51] Int. Cl.[7] .................................................. C08G 59/68
[52] U.S. Cl. ........................... 528/94; 523/417; 523/421
[58] Field of Search .................... 523/417, 421; 528/94

[56] References Cited

U.S. PATENT DOCUMENTS 5,541,000  7/1996  Hardy et al. ........................ 428/413

FOREIGN PATENT DOCUMENTS 06321915  11/1994  Japan .

*Primary Examiner*—Melvyn I. Marquis
*Assistant Examiner*—D. Aylward
*Attorney, Agent, or Firm*—Anderson Kill & Olick

[57] ABSTRACT

A heat-curable resin composition comprising a multifunctional epoxy resin monomer and a heat-latent curing agent of formula (I) provides a cured epoxy resin having good thermal and dimensional stability:

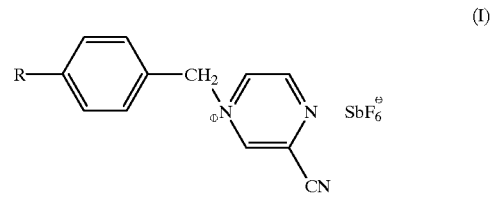

wherein:

R is hydrogen, a $C_{1-4}$ alkyl or $C_{1-4}$ alkoxy group.

7 Claims, No Drawings

HEAT-CURABLE EPOXY RESIN COMPOSITION

FIELD OF THE INVENTION

The present invention relates to a heat-curable resin composition comprising a novel heat-latent curing agent for the production of a cured epoxy resin having good thermal and dimensional stability, and a method for the production of said cured resin.

BACKGROUND OF THE INVENTION

Epoxy resins possess good thermal, mechanical, electrical, adhesive, and weather-resistant properties, and, therefore, have been widely used in paints, coating agents, electrical insulation materials, matrix resins for fiber-reinforced products and the like.

However, conventional epoxy resins have poor thermostability at a temperature above 180° C. As the thermostability of an epoxy resin depends on the ability of a curing agent to form a crosslinked three dimensional network, selection of the curing agent is of utmost importance for the production of a thermostable (i.e., heat-resistant) epoxy resin.

Conventional curing agents such as amines and anhydrides have problems in that: lengthy curing time is required; environmentally harmful gases are released during the curing procedure; large amounts thereof are required, thereby increasing the production cost; and the properties of the end products are often sacrificed due to the curing agents, particularly when they are employed in combination with additional agents such as fillers, plasticizers, releasing agents, flame retardants, diluents, dyes and the like.

In order to solve the above problems, extensive R & D efforts have been made to develop, e.g., a heat-latent, cationic polymerization initiator which is normally inactive during storage but is capable of initiating a cationic polymerization reaction on heating to an elevated temperature. This type of polymerization initiator is generally referred to as a heat-latent curing agent.

For example, U.S. Pat. Nos. 5,070,161 and 5,066,722 describe the use of benzylpyridinium or benzylammonium salts of a non-nucleophilic anion; and U.S. Pat. No. 5,132,377 discloses the use of quaternary ammonium salts of non-nucleophilic anions, the quaternary ammonium ion having an α-substituted benzyl group attached to the quaternary nitrogen atom thereof, as heat-latent, cationic polymerization initiators.

Polymerization initiators disclosed in the above-mentioned references are capable of curing epoxy resins quickly when heated to an elevated temperature (see J. Gu et al., *J. Appl. Polym. Sci.*, 30, 2997–3007 (1985); K. Morio et al., *J. Appl. Polym. Sci.*, 32, 5727–5732 (1986)). However, these heat-latent curing agents have a problem in that resin shrinkage occurs during the process of curing.

Therefore, there has continued to exist a need to develop an effective curing agent capable of providing an epoxy resin having good thermal and dimensional stability.

SUMMARY OF THE INVENTION

Accordingly, it is an object of the present invention to provide a heat-curable resin composition for the production of a cured epoxy resin having improved thermostability and dimensional stability.

In accordance with one aspect of the present invention, there is provided a heat-curable resinous composition, for the production of a heat-resistant epoxy resin, comprising a resin monomer having two or more epoxy functional groups and a curing agent of formula (I):

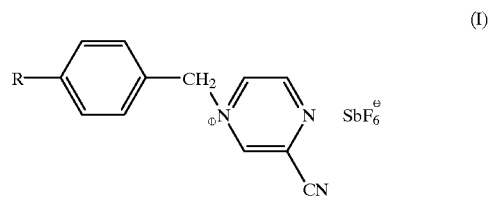

(I)

wherein:
R is hydrogen, a $C_{1-4}$ alkyl or $C_{1-4}$ alkoxy group.

DETAILED DESCRIPTION OF THE INVENTION

The novel heat-curable resin composition in accordance with the present invention comprises the compound of formula (I) as a curing agent:

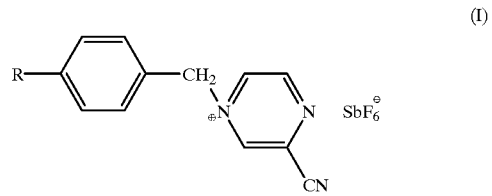

(I)

wherein:
R is hydrogen, a $C_{1-4}$ alkyl or $C_{1-4}$ alkoxy group.

Preferably, the compound of formula (I) is N-benzyl-5-cyanopyrazinium hexafluoroantimonate.

The compound of formula (I) may be prepared by reacting benzyl bromide or a suitably substituted benzyl bromide with cyanopyrazine to form a pyrazinium salt, dissolving the pyrazinium salt in an aqueous solution, adding a small amount of $NaSbF_6$ thereto to form a solid, purifying the solid by recrystallization from methanol, and drying the purified solid.

The compound of formula (I) according to the present invention may be added to an epoxy resin monomer in an amount ranging from 0.01 to 50 parts, preferably 0.1 to 20 parts based on 100 parts of the epoxy resin monomer. The compound of formula (I) may be used alone or in combination with conventional curing agents such as amines and anhydrides, if desired.

The epoxy resin monomer suitable for use in the present invention is a monomeric compound having two or more epoxy functional groups, and diglycidyl ether of bisphenol-A (DGEBA) is preferred.

The conventional amine curing agent which may be used in combination with the compound of formula (I) is preferably 4,4'-diaminodiphenyl methane (DDM), while the conventional anhydride curing agent which may be used in combination with the compound of formula (I) is preferably phthalic anhydride.

The heat-curable composition of the present invention containing the compound of formula (I) as a curing agent can be cured quickly without releasing any harmful gases by heating the composition at a temperature ranging from 50 to 150° C.

The epoxy resin obtained by curing the inventive composition in accordance with the method described above has improved thermostability such that it does not undergo thermal decomposition at below 200° C. In this regard, the present inventors have identified a new precursor material formed during the curing reaction of the composition of the present invention. This precursor material has a crosslinked structure formed by interactions of the cyanopyrazinium and hexafluoroantimonate ions with epoxy functional groups of the resin monomers. This precursor material has good thermostability, and for this reason, the cured epoxy resin obtained in accordance with the present invention is highly table even at an elevated temperature of 200° C.

The viscosity of the epoxy resin composition of the present invention increases sharply at 140° C. or higher to become a solid, and it exhibits an unique linear swelling property during the curing process; its volume increase by 0.01% to 15%. As the conventional epoxy resins shrink upon curing, the heat-curable resin composition of the present invention is characterized by its unique dimensional stability.

As described above, the inventive composition generates no harmful gases during the curing reaction, and thus, it can be effectively applied in the production of electrical and electronic parts, printed circuit board substrates, insulating materials, adhesives and fiber-reinforced prepregs.

The following Examples are intended to illustrate the present invention more specifically, without limiting the scope of the invention.

In Examples, the properties of the epoxy resin was evaluated in accordance with the following methods.

1. Thermal Decomposition Initiating Temperature

The thermal decomposition initiating temperature of an epoxy resin was determined with a thermogravimetric analysis (TGA) apparatus at a nitrogen flow rate of 50cm$^3$/min and a temperature program rate of 10° C. per 1 minute.

2. Linear Swelling Index

The linear swelling index of an epoxy resin was determined with a thermomechanical analysis (TMA) apparatus at a nitrogen flow rate of 50cm$^3$/min and a temperature program rate of 10° C. per 1 minute.

REFERENCE EXAMPLE 1

1 part of N-benzyl-5-cyanopyrazinium hexafluoroantimonate was added to 100 parts of bifunctional epoxy resin monomer YH-300 (commercially available from Kukdo chemical co. in Korea, DGEBA). The resulting mixture was allowed to stand under sunlight (room temperature) for three days to obtain an elastic solid.

The thermal decomposition initiating temperature and maximum thermal decomposition temperature of the elastic solid was 282° C. and 390° C., respectively; and the linear swelling index was $1.05 \times 10^{-4}$ $K^{-1}$.

Considering that bifunctional epoxy resins cured using conventional curing agents (DDM) typically has a decomposition temperature ranging from 90° C. to 150° C., the epoxy resin cured in accordance with the present invention showed an exceptionally high thermal decomposition temperature. Further, no shrinkage of the epoxy resin occurred during the curing reaction.

REFERENCE EXAMPLE 2

5 part of N-benzyl-5-cyanopyrazinium hexafluoroantimonate was added to 100 parts of bifunctional epoxy resin monomer YD-128 (commercially available from Kukdo chemical co. in Korea, DGEBA). The resulting mixture was allowed to stand under sunlight (room temperature) for three days to obtain an elastic solid.

The thermal decomposition initiating temperature and maximum thermal decomposition temperature of the elastic solid was 325° C. and 430° C., respectively; and the linear swelling index was $2.011 \times 10^{-4}$ $K^{-1}$.

Considering that bifunctional epoxy resins cured using conventional curing agents (DDM) typically has a decomposition temperature ranging from 90° C. to 150° C., the epoxy resin cured in accordance with the present invention showed an exceptionally high thermal decomposition temperature. Further, no shrinkage of the epoxy resin occurred during the curing reaction.

EXAMPLE 1

0.1 part of N-benzyl-5-cyanopyrazinium hexafluoroantimonate was added to 100 parts of bifunctional epoxy resin monomer LY-556 (commercially available from Ciba Geigy co. in Japan, DGEBA). The resulting mixture was allowed to stand at 100° C. for one hour to obtain an elastic solid.

The thermal decomposition initiating temperature and maximum thermal decomposition temperature of the elastic solid was 222° C. and 440° C., respectively; and the linear swelling index was $1.542 \times 10^{-4}$ $K^{-1}$.

Considering that bifunctional epoxy resins cured using conventional curing agents (DDM) typically has a decomposition temperature ranging from 90° C. to 150° C., the epoxy resin cured in accordance with the present invention showed an exceptionally high thermal decomposition temperature. Further, no shrinkage of the epoxy resin occurred during the curing reaction.

EXAMPLE 2

0.2 part of N-benzyl-5-cyanopyrazinium hexafluoroantimonate was added to 100 parts of bifunctional epoxy resin monomer LY-5082 (commercially available from Ciba Geigy co. in Japan, DGEBA). The resulting mixture was allowed to stand at 100° C. for one hour to obtain an elastic solid.

The thermal decomposition initiating temperature and maximum thermal decomposition temperature of the elastic solid was 250° C. and 440° C., respectively; and the linear swelling index was $3.058 \times 10^{-4}$ $K^{-1}$.

Considering that bifunctional epoxy resins cured using conventional curing agents (DDM) typically has a decomposition temperature ranging from 90° C. to 150° C., the epoxy resin cured in accordance with the present invention showed an exceptionally high thermal decomposition temperature. Further, no shrinkage of the epoxy resin occurred during the curing reaction.

EXAMPLE 3

1 part of N-benzyl-5-cyanopyrazinium hexafluoroantimonate was added to 100 parts of bifunctional epoxy resin monomer LY-556 (commercially available from Ciba Geigy co. in Japan, DGEBA). The resulting mixture was allowed to stand at 100° C. for one hour to obtain an elastic solid.

The thermal decomposition initiating temperature and maximum thermal decomposition temperature of the elastic solid was 250° C. and 400° C., respectively; and the linear swelling index was $2.078 \times 10^{-4}$ $K^{-1}$.

Considering that bifunctional epoxy resins cured using conventional curing agents (DDM) typically has a decomposition temperature ranging from 90° C. to 150° C., the epoxy resin cured in accordance with the present invention showed an exceptionally high thermal decomposition temperature. Further, no shrinkage of the epoxy resin occurred during the curing reaction.

As shown above, the cured epoxy resin prepared in each of the Examples is superior over the resin cured using conventional curing agents in terms of thermostability and dimensional stability.

While the invention has been described with respect to the specific embodiments, it should be recognized that various modifications and changes may be made by those skilled in the art to the invention which also fall within the scope of the invention as defined by the appended claims.

What is claimed is:

1. A heat-curable resinous composition, for the production of a heat-resistant epoxy resin, comprising a resin monomer having two or more epoxy functional groups and a curing agent of formula (I):

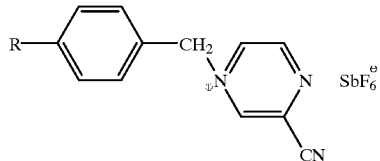

wherein:

R is hydrogen, a $C_{1-4}$ alkyl or $C_{1-4}$ alkoxy group.

2. The composition of claim 1, wherein R is hydrogen.

3. The composition of claim 1, wherein the resin monomer is diglycidyl ether of bisphenol-A.

4. The composition of claim 1 further comprising an amine or anhydride component.

5. The composition of claim 4, wherein the amine component is 4,4'-diaminodiphenyl methane.

6. The composition of claim 4, wherein the anhydride component is phthalic anhydride.

7. A method for the production of a heat-resistant epoxy resin comprising heating the composition of claim 1 at a temperature ranging from 50° C. to 150° C.

* * * * *